(12) United States Patent
Yoon et al.

(10) Patent No.: US 7,106,613 B2
(45) Date of Patent: Sep. 12, 2006

(54) MEMORY MODULE AND A METHOD OF ARRANGING A SIGNAL LINE OF THE SAME

(75) Inventors: Chil-Nam Yoon, Suwon-si (KR); Byung-Se So, Gyeonggi-do (KR); Jung-Joon Lee, Seoul (KR); Jae-Jun Lee, Seongnam-si (KR); Young-Jun Park, Euiwang-si (KR); Il-Sung Yu, Suwon-si (KR)

(73) Assignee: Samsung Electronics Co., Ltd., (KR)

( * ) Notice: Subject to any disclaimer, the term of this patent is extended or adjusted under 35 U.S.C. 154(b) by 8 days.

(21) Appl. No.: 11/064,671

(22) Filed: Feb. 24, 2005

(65) Prior Publication Data

US 2005/0185439 A1 Aug. 25, 2005

(30) Foreign Application Priority Data

Feb. 24, 2004 (KR) .......................... 10-2004-12406

(51) Int. Cl.
*G11C 5/06* (2006.01)
(52) U.S. Cl. ....................................... 365/63
(58) Field of Classification Search .................. 365/63, 365/191, 194; 361/760, 777; 257/698
See application file for complete search history.

(56) References Cited

U.S. PATENT DOCUMENTS

| | | | |
|---|---|---|---|
| 6,348,728 B1 * | 2/2002 | Aiba et al. .................. | 257/678 |
| 6,414,868 B1 | 7/2002 | Wong et al. | |
| 6,683,372 B1 | 1/2004 | Wong et al. | |
| 6,747,478 B1 * | 6/2004 | Madurawe ................... | 326/39 |
| 2002/0038404 A1 | 3/2002 | Ryan | |

FOREIGN PATENT DOCUMENTS

| KR | 1996-0026780 | 7/1996 |
|---|---|---|
| KR | 2002-0070979 | 9/2002 |

\* cited by examiner

*Primary Examiner*—Vu A. Le
(74) *Attorney, Agent, or Firm*—F. Chau & Associates, LLC

(57) ABSTRACT

The present invention discloses a memory module and a method of arranging a signal line of the same. The method of arranging a signal line of a memory module comprises: classifying a plurality of memories into a first group including an odd number of memories and a second group including an even number of memories; arranging first branch points corresponding to the plurality of memories and respectively connecting the first branch points to the plurality of memories through first signal lines; arranging a second branch point located at a middle of the second group for respectively connecting between the first branch points adjacent to each other of the second group and between the first branch points adjacent to the second branch points and the second branch point through second signal lines; arranging a third branch point located at a middle of the second group, receiving an external signal, and connecting the third branch point and the second branch point of the second group through a third signal line; and connecting between the second branch point of the second group and the first branch point of the first group through a fourth signal line.

18 Claims, 7 Drawing Sheets

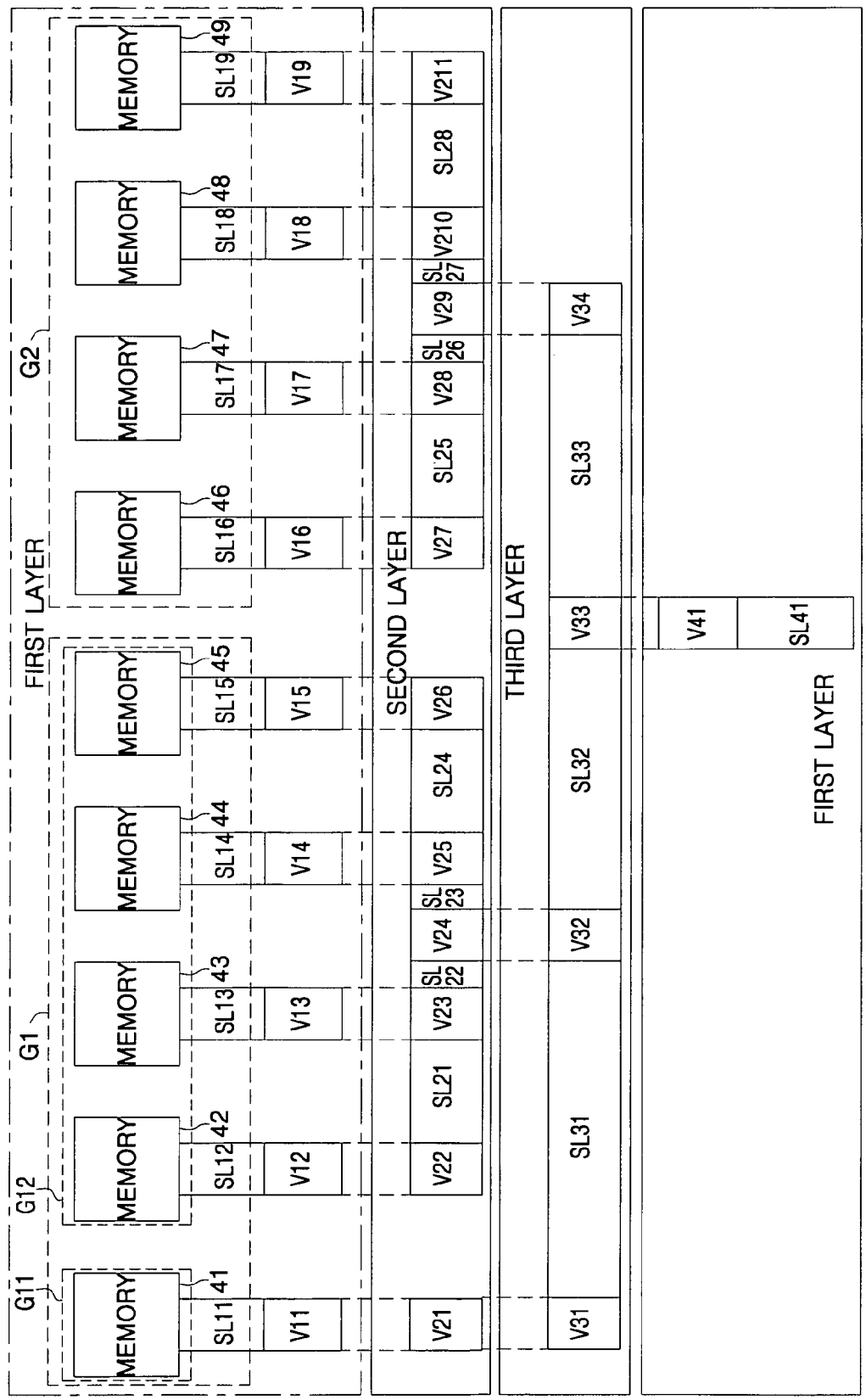

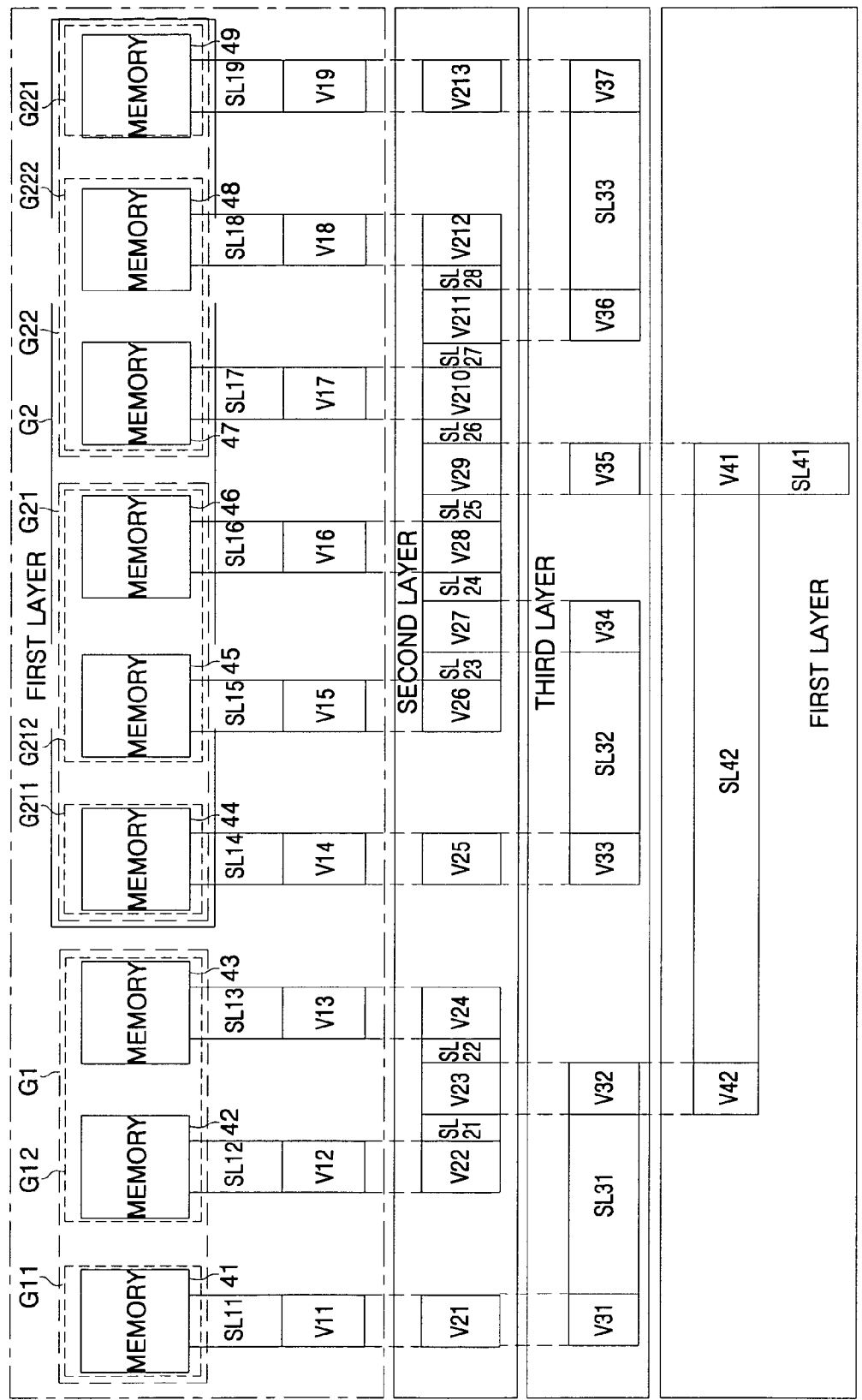

MEMORY MODULE AND A METHOD OF ARRANGING A SIGNAL LINE OF THE SAME

CROSS-REFERENCE TO RELATED APPLICATION

This application claims the benefit of Korean Patent Application No. 2004-12406, filed on Feb. 24, 2004, the disclosure of which is incorporated herein by reference in its entirety.

FIELD OF THE INVENTION

The present invention relates to a memory module and, more particularly, to a method of arranging signal lines of a memory module.

DESCRIPTION OF THE RELATED ART

Memory modules are typically used to extend memory capacity in a computer system and come in the form of a card on which a plurality of memories such as a random access memory (RAM), a dynamic random access memory (DRAM), and a synchronous dynamic random access memory (SDRAM) are located. In use, the memory module is coupled to an expansion slot positioned on a mother board of a computer system.

FIG. 1 illustrates a conventional memory module. As shown in FIG. 1, the memory module comprises input/output (I/O) pads 1, a register 2, a synchronization signal generator 3, and a plurality of memories 41 to 49.

The I/O pad 1 can be coupled to an expansion slot of a mother board of a computer system. The I/O pad 1 receives data, a command signal, an address signal, and speed control information, which are transmitted from the computer system, and retransmits them to an internal circuit of the memory module. The I/O pad 1 also receives data generated from the internal circuit of the memory module and retransmits the data to the mother board of the computer system.

The register 2 receives and buffers the command signal and the address signal transmitted from the computer system through the I/O pad 1 and transmits the command signal and the address signal buffered by a synchronization signal transmitted from the synchronization signal generator 3 to the plurality of memories 41 to 49.

The synchronization signal generator 3 generates the synchronization signal needed by the internal circuit of the memory module in response to the speed control information transmitted through the I/O pad 1 and provides the synchronization signal to the register 2 and the plurality of memories 41 to 49. A phase locked loop (PLL) circuit is typically used as the synchronization signal generator 3.

Each of the plurality of memories 41 to 49 receives data transmitted through the I/O pad 1, and performs operations according to the command signal and the address signal transmitted from the register 2.

The memory module described above may be classified as a single in-line memory module (SIMM) or a dual in-line memory module (DIMM) according to the type of memory package used.

A SIMM is one in which, for example, the memory module of FIG. 1 is arranged on one side or both sides thereof, and the I/O pads of one or both sides are electrically coupled to perform the same operation. A DIMM is one in which, for example, the memory module of FIG. 1 is arranged on both sides thereof, however, the I/O pads of both sides are electrically independent from each other and data is individually transmitted through the corresponding I/O pads. Thus, the DIMM increases the memory module's density while suppressing an increase of the memory module's size.

An important aspect associated with the development of memory modules is directed to a method of arranging signal lines through which, for example, the plurality of memories 41 to 49, receive the command signal and the address signal transmitted from the computer system.

FIG. 2 illustrates a signal line arrangement of the conventional memory module of FIG. 1.

As shown in FIG. 2, if an odd number of memories, i.e., 9 memories 41 to 49 are located on the memory module, the memory module is divided into a first group G1 comprised of an odd number of memories, i.e., 5 memories 41 to 45 and a second group G2 comprised of an even number of memories, i.e., 4 memories 46 to 49.

A register 2 is arranged at the middle of the memory module, i.e., in between the first and second groups G1 and G2.

At a first layer, the register 2 and the odd number of memories 41 to 49 are arranged thereon, an odd number of VIAs V11 to V19 are arranged at locations corresponding to the odd number of memories 41 to 49, and first signal lines SL11 to SL19, which respectively connect the odd number of memories 41 to 49 and the VIAs V11 to V19, are also arranged thereon.

Here, the VIAs V11 to V19 extend to different layers, and corresponding VIAs are located at same locations on each of the different layers to connect an interlayer between each of the different layers.

Also on the first layer, a fourth signal line SL41 is arranged such that it connects the I/O pad 1, which receives the command signal and the address signal transmitted from the computer system, to the register 2.

On the first layer, fourth VIAs V41 and V42 are also arranged to apply an output signal of the register 2 to the first group G1 and the second group G2, and fourth signal lines SL42 and SL43 are arranged thereon and respectively connect the register 2 to the fourth VIAs V41 and V42.

On a second layer, second VIAs V21 to V210 are arranged to be connected to the first VIAs V11 to V19, and a second VIA V28 is further arranged at the middle of the second group G2 and connects an interlayer between the second layer and a third layer.

Also on the second layer, second signal lines SL21 to SL24 are arranged to respectively connect to the second VIAs V21 to V25 of the first group G1, and second signal lines SL25 to SL28 are arranged to respectively connect to the second VIAs V26 to V210 of the second group G2.

On a third layer, third VIAs V31 and V34 are arranged at the middle of the first and second groups G1 and G2 to be connected with the second VIAs V23 and V28, respectively. Third VIAs V32 and V33 are arranged near the middle of the first and second groups G1 and G2 to be connected to the third VIAs V41 and V42, which function to distribute an output signal of the register 2 to the first and second groups G1 and G2, respectively.

Also, on the third layer, a third signal line SL31 is arranged to connect the VIAs V31 and V32, and a third signal line SL32 is arranged to connect the VIAs V33 and V34.

The memory module having a signal line arrangement as described above is a layered package memory module having a layered structure where the first signal lines SL11 to SL19, the fourth signal lines SL41 and SL42, the second signal lines SL21 to SL28, and the third signal lines SL31 and SL32 are arranged on different layers but are connected to each other through corresponding VIAs arranged at same points on the different layers.

When a memory module has, for example, the odd number of memories 41 to 49, the signal lines are arranged as described above and groups, for example, G1 and G2, of the odd number of memories 41 to 49 are arranged on either a left side or a right side of the register 2, which is arranged at the middle of the memory module.

If an odd number of memories 41 to 45 are arranged on a left side of the memory module, e.g., like the first group G1, and an even number memories 46 to 49 are arranged on a right side of the memory module, e.g., like the second group G2, the even number of memories 46 to 49 are respectively connected to the first signal lines SL16 to SL19, the second signal lines SL25 to SL28, and the third signal line SL32 and thus receive a signal outputted from the register 2 through the signal lines SL25 to SL28 and SL32.

In such an arrangement, the even number of memories 46 to 49 have a signal line loading that is almost constant, thus they receive a signal having a size which is reduced by a constant value due to a contact signal line load.

However, the odd number of memories 41 to 45 of the first group G1 have a symmetric signal line loading structure, which offsets a reflection of an input signal, thereby reducing a distortion associated with signals applied to the odd number of memories 41 to 45.

On the other hand, some of the memories, e.g., 41, 42, 44, and 45 of the first group G1 have a signal line loading associated with the first signal lines SL11, SL12, SL14, and SL15, the second signal lines SL21 to SL24, and the third signal line SL31 connected thereto. In addition, the memory 43 arranged at the middle of the first group G1 has a signal line loading associated with the first signal line SL13 and the third signal line SL31.

Therefore, the signal line loading of the memory 43 is small, and the memory 43 receives a signal having a size relatively larger than the signals received by the other memories 41, 42, 44, and 45.

In addition, the memory 43 arranged at the middle of the first group G1 has an asymmetric signal line loading structure with respect to a signal line loading structure of the other memories 41, 42, 44, and 45, thus an input signal of the memory 43 has a distortion resulting from a reflection of the input signal.

FIG. 3 is a signal diagram illustrating signals applied to respective memories of FIG. 1.

As shown in FIG. 3, a signal input to the memory 43 arranged at the middle of the first group G1 has a distortion indicated by a knee shape. The resulting knee shaped distortion reduces a size of a valid signal window, thus damaging a time margin of a signal.

In order to remove such a distortion from high speed and highly integrated semiconductor devices, a signal line loading of, for example, the memory 43 has been increased by making the first signal line SL13 longer than the fourth signal lines SL41 and SL42 and SL44 to SL49 of the other memories 41, 42, 44, and 45. However, this approach is restricted to an area in which the first signal line SL13 is to be arranged.

A need therefore exists for a memory module that has uniform signal line loading for providing a stable signal to memories therein and a method of arranging signal lines of the memory module.

SUMMARY OF THE INVENTION

A memory module is provided, comprising: memories having a first group including an odd number of memories and a second group including an even number of memories; first signal lines including first branch points corresponding to the memories and connecting the first branch points to the memories, respectively; second signal lines including a second branch point located at a middle of the second group and connecting between the first branch points adjacent to each other of the second group, and between the first branch points adjacent to the second branch point and the second branch point; a third signal line including a third branch point receiving an external signal and connecting between the third branch point and the second branch point of the second group; and a fourth signal line connecting between the second branch point of the second group and the first branch point of the first group.

Further provided is a memory module, comprising: memories including an even number of groups each of the even number of groups having an odd number of at least three memories and a first group including an odd number of memories arranged away from a middle of the even number of groups and a second group including an even number of memories arranged adjacent to the middle of the even number of groups; first signal lines having first branch points corresponding the memories and respectively connecting the first branch points to the memories; second signal lines having second branch points located at a middle of the second groups and respectively connecting between the second branch points and the first branch points arranged in a same group as the first branch points adjacent to the second branch points; third signal lines having a third branch point receiving an external signal and located at a middle of the even number of groups, and connecting between the third branch point and the first branch points adjacent to the third branch point; and a fourth signal line connecting between the second branch points and the first branch point of the first group arranged in the same group as the second branch points.

Further provided is a method of arranging a signal line of a memory module, comprising: classifying memories into a first group including an odd number of memories and a second group including an even number of memories; arranging first branch points corresponding to the memories and connecting the first branch points to the memories, respectively, through first signal lines; arranging a second branch point located at a middle of the second group and connecting between the first branch points adjacent to each other of the second group and between the first branch points adjacent to the second branch points and the second branch point, respectively, through second signal lines; arranging a third branch point located at a middle of the second group and receiving an external signal, and connecting between the third branch point and the second branch point of the second group through a third signal line; and connecting between the second branch point of the second group and the first branch point of the first group through a fourth signal line.

Further provided is a method of arranging a signal line of a memory module, comprising: classifying memories into an even number of group's respectively having an odd number of at least three memories, and arranging the even number of groups into a first group including an odd number of memories arranged at a location away from a middle of the even number of groups and a second group including an even number of memories arranged at a location adjacent to the middle of the even number of groups; arranging first branch points corresponding the memories and respectively connecting the first branch points to the memories through first signal lines; arranging second branch points located at a middle of the second group and respectively connecting between the second branch points and the first branch points arranged in a same group as the second branch points adjacent to the second branch points through second signal lines; arranging a third branch point receiving an external signal and located at a middle of the even number of groups, and connecting between the third branch point to the first branch points adjacent to the third branch point through third signal lines; and connecting between the second branch points to the first branch point of the first group arranged in the same group as the second branch points through a fourth signal line.

BRIEF DESCRIPTION OF THE DRAWINGS

The above and other features of the present invention will become more apparent to those of ordinary skill in the art by describing in detail preferred embodiments thereof with reference to the attached drawings in which:

FIG. 6 illustrates a memory module according to a second preferred embodiment of the present invention; and FIG. 7 illustrates a signal line arrangement of a memory module according to a third preferred embodiment of the present invention.

DETAILED DESCRIPTION OF PREFERRED EMBODIMENTS OF THE INVENTION

Figure 4:
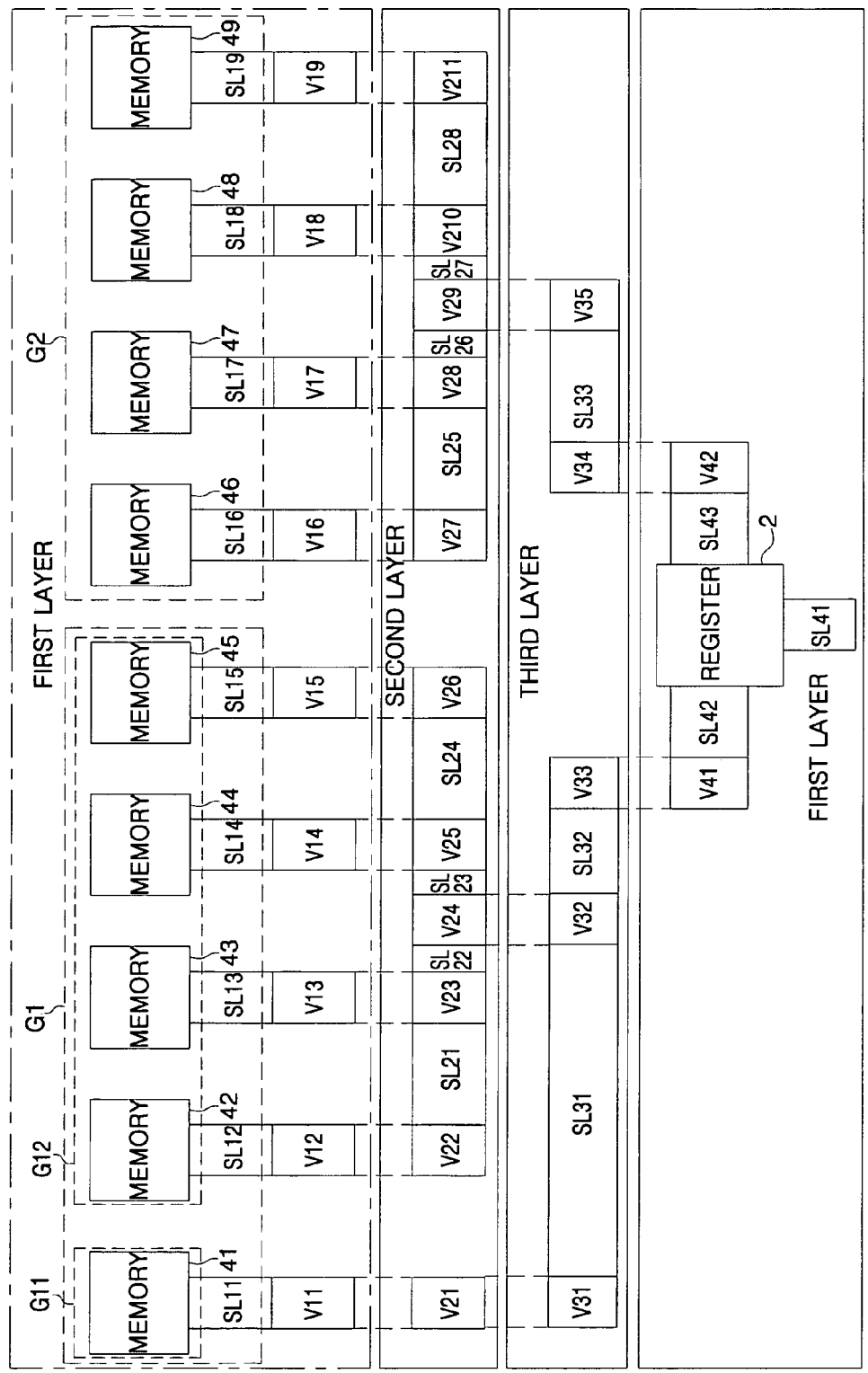
FIG. 4 illustrates a memory module according to a first preferred embodiment of the present invention.

FIG. 4 illustrates a memory module according to a first preferred embodiment of the present invention.

Figure 1:
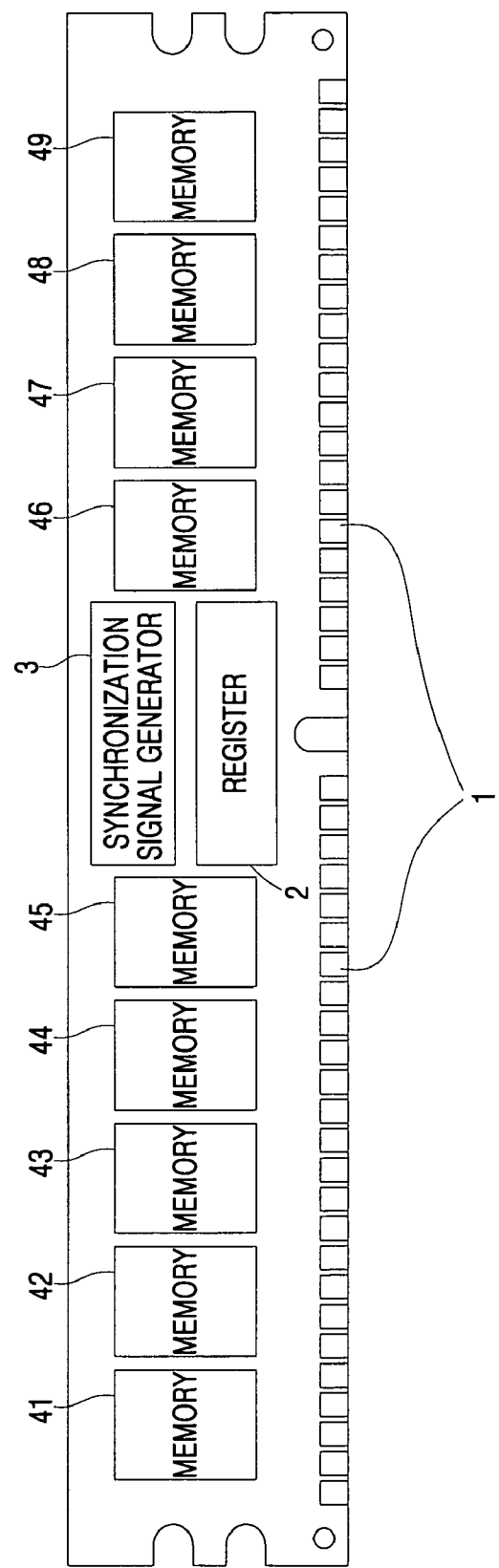
FIG. 1 illustrates a conventional memory module.
Figure 2:
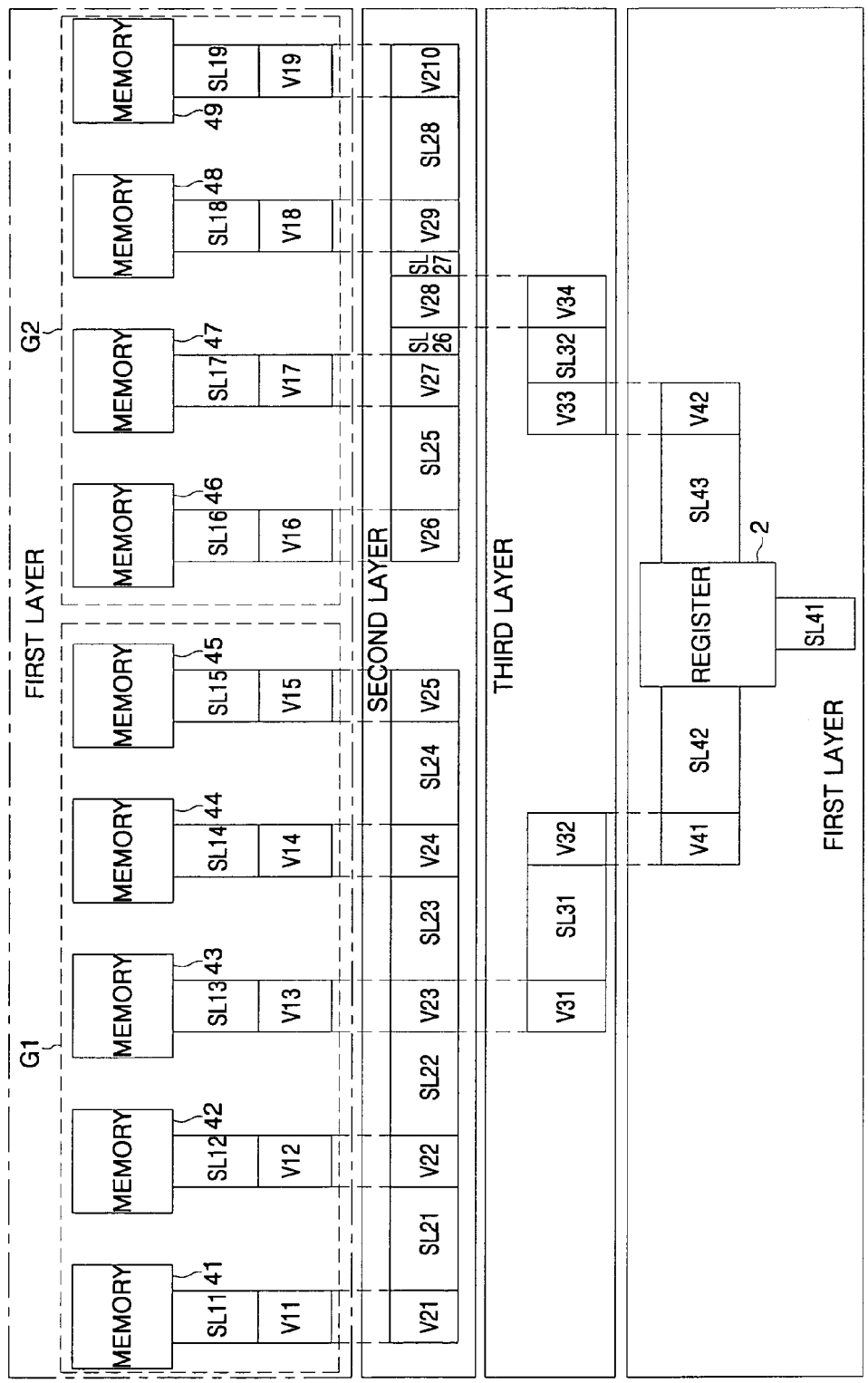
FIG. 2 illustrates a signal line arrangement of the conventional memory module of FIG. 1.
Figure 3:
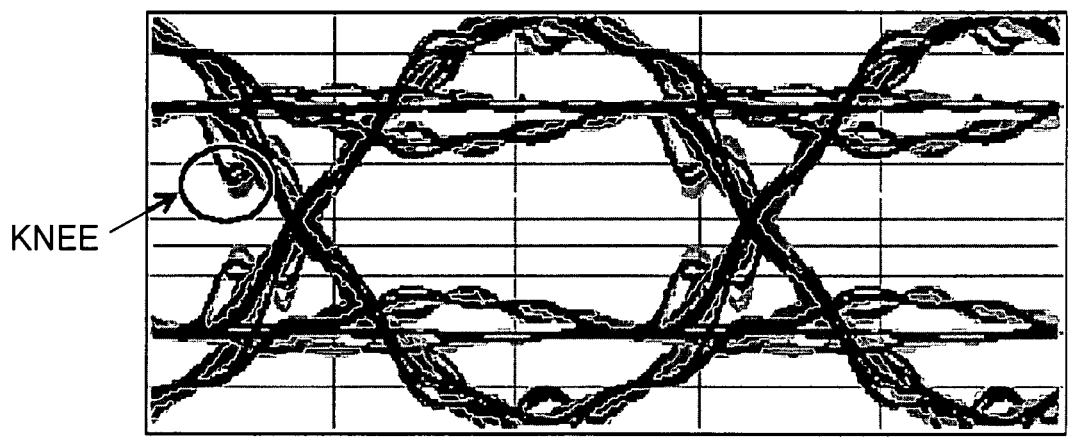
FIG. 3 is a signal diagram illustrating signals applied to respective memories of the conventional memory module of FIG. 1.

As shown in FIG. 4, an arrangement on a first layer of a first group G1 of memories 41 to 45, a second group G2 of memories 46 to 49, VIAs V11 to V19, and first and fourth signal lines S11 to SL19 and S41 is the same as that of FIGS. 1 and 2, thus a description regarding the connections between these elements omitted.

In addition, an arrangement of second signal lines SL25 to SL28 of the memories 46 to 49 of the second group G2 arranged at a right side of a register 2 of the memory module is the same as that of FIGS. 1 and 2, thus a description regarding the connections between these elements is omitted.

As shown in FIG. 4, second VIAs V21 to V23 and V25 to V211 are arranged on a second layer to be respectively connected to the first VIAs V11 to V19 arranged on the first layer, and a second VIA V24 is arranged at the middle of a second group G12 of the first group G1 to be connected to a corresponding VIA V32 arranged on a third layer.

Second signal lines SL21 to SL24 are also arranged on the second layer to respectively connect the second VIAs V22 to V26 to the second group G12 of the first group G1.

On the third layer, third VIAs V31 and V32 are arranged to be respectively connected to the second VIA V21 of a first group G11 and the second VIA V24 is arranged at the middle of the second group G12.

Also on the third layer, a third VIA V33 is arranged to be connected to a fourth VIA V41, which functions to distribute an output signal of the register 2, to the first group G1. Third signal lines SL31 and SL32 are also arranged on the third layer to connect the third VIAs V31 and V32 to the first group G1.

As shown in FIG. 4, when an odd number of memories 41 to 45 are arranged on the memory module, the third signal line SL31 is additionally arranged on the third layer, and an external signal is applied to the memory 41 arranged on an edge portion of the memory module through the third signal line SL31.

Thus, all of the odd number of memories 41 to 45 receive a signal having uniform signal line loading, thereby preventing an output signal of the register 2 from being directly applied to a specific memory.

Figure 5:
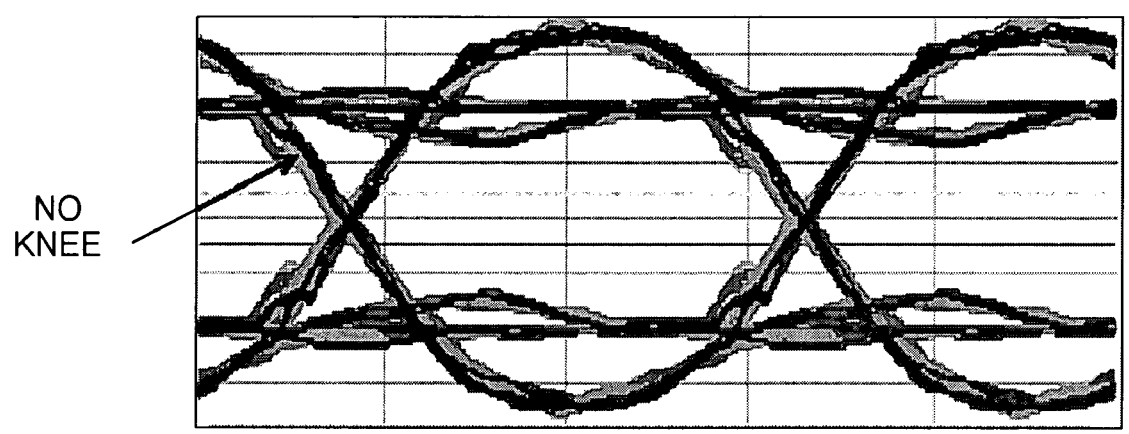
FIG. 5 is a signal diagram illustrating signals applied to respective memories of the memory module according to the first preferred embodiment of the present invention.

Because the third signal line SL31 is arranged on the third layer having a substantial amount of space, layers of the memory module can be maintained "as is" without restricting additional signal line routing. Therefore, signals applied to respective memories, e.g., 41 to 45 of the memory module do not have a knee-shaped distortion as shown in FIG. 5.

In addition, loading on the signal lines SL16 to SL19 and SL25 to SL28 of the even number of memories 46 to 49, except in a memory arranged on an edge, is symmetric thereby improving the characteristics of the signals applied to the memories 46 to 49.

Therefore, the present preferred embodiment not only prevents the signal applied to a specific memory from having a knee-shaped distortion but also increases the size of a valid signal window. Thus, a time margin of the signal is increased and development of high speed and highly integrated semiconductor devices is enhanced.

As a signal line arrangement of the memory module having a register has been described, a signal line arrangement of a memory module having no register will now be explained with reference to FIG. 6.

FIG. 6 illustrates a memory module according to a second preferred embodiment of the present invention. A detailed description of portions of FIG. 6 which have the same signal line arrangement as FIG. 4 is omitted.

As shown in FIG. 6, the fourth VIA V41 is arranged on the first layer at the middle of the first and second groups G1 and G2 for applying an external signal to an internal layer, and the fourth VIA V41 is connected to an I/O pad (as shown, for example, in FIG. 1), which receives a command signal and an address signal from a computer system through a fourth signal line SL41.

Also, on the third layer, the third VIA V33 is arranged at the middle of the first and second groups G1 and G2 to be connected to the fourth VIA V41.

The third VIAs V31, V32 and V34 are also arranged on the third layer for respective interlayer connection with the second VIAs V21 to V23, V25 and V26 of the first group G1, the second VIA V24 arranged at the middle of the second small group G12, and the second VIA V29 arranged at the middle of the second group G2.

The third signal lines SL31 to SL33 are also arranged on the third layer to connect to the third VIAs V31 to V34.

FIG. 7 illustrates a signal line arrangement of a memory module according to a third preferred embodiment of the present invention.

The memory module of FIG. 7 is divided into a first group G1 including an odd number of memories, i.e., three memories 41 to 43, and a second group G2 including an even number of memories, i.e., six memories 44 to 49. The second group G2 is divided into a group G21 including an odd number of memories, i.e., three memories 44 to 46, and a group G22 also including an odd number of memories, i.e., three memories 47 to 49.

The first group G1 is also divided into a first group G11 including one memory 41 which is away from a middle portion between the first and second groups G1 and G2 and a second group G12 including two memories 42 and 43 which are adjacent to the middle portion between the first and second groups G1 and G2.

The group G21 of the second group G2 is divided into a first group G211 including one memory 44 which is away from the middle of the second group G2 and a second group G212 including two memories 45 and 46 which are adjacent to the middle of the second group G2. The group G22 of the second group G2 is divided into a first group G221 including one memory 49 which is away from the middle of the second group G2 and a second group G222 including two memories 47 and 48 which are adjacent to the middle of the second group G2.

When the memory module is divided as described above with reference to FIG. 7, a plurality of first VIAs V11 to V19 are arranged on a first layer to correspond to the memories 41 to 49, and first signal lines SL11 to SL19 are arranged on the first layer to respectively connect the first VIAs V11 to V19 to their corresponding memories 41 to 49.

On a second layer, second VIAs V23, V27, and V211 for receiving external signals are respectively arranged at the middle of the second groups G12, G212 and G222. A second VIA V29 for receiving an external signal is also arranged on the second layer at the middle of the second group G2.

Second VIAs V21, V22, V24, V25, V26, V28, V210, V212, and V213 are arranged to be respectively connected to the first VIAs V11 to V19 arranged on the first layer and second signal lines SL21 and SL22 are arranged on the second layer to connect to the second VIAs V22 to V24.

In addition, second signal lines SL25 and SL26 are arranged to connect the second VIA V29 arranged at the middle of the second group G2, the second VIA V28 of the second group G212 of the group G21, and the first VIA V210 of the second group G222 of the group G22.

On the third layer, third VIAs V31 to V37 are arranged to be respectively connected to the second VIAs V21, V25, V213 belonging to the first groups G11, G211 and G221, the second VIAs V23, V27 and V211 are arranged at the middle of the second groups G12, G212, and G222, and the second VIA V29 arranged at the middle of the second group G2.

In addition, third signal lines SL31 to SL33 are arranged to respectively connect to the third VIAs V31 and V32, V33 and V34, and V36 and V37 which respectively belong to the first group G1, the group G21, and the group G22.

On a fourth layer, fourth VIAs V41 and V42 are arranged to be respectively connected to the third VIA V32 arranged at the middle of the second group G12 of the first group G1 and the third VIA V35 arranged at the middle of the second group G2, and a fourth signal line SL42 is arranged to connect to the fourth VIAs V41 and V42.

Although the third preferred embodiment has been described as including a memory module having no register it is to be understood by one having ordinary skill in the art that the memory module of the third preferred embodiment can include a register.

The memory module and the signal line arrangement method according to the present invention provide a uniform signal line loading to a plurality of memories, thereby providing stable signals to the plurality of memories. Thus, increasing the memory module's time margin and enabling development of high speed and highly integrated semiconductor devices.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A memory module, comprising:
a plurality of memories having a first group including an odd number of memories and a second group including an even number of memories;
first signal lines including first branch points corresponding to the plurality of memories for respectively connecting the first branch points to the plurality of memories;
second signal lines including a second branch point located at a middle of the second group for respectively connecting between the first branch points adjacent to each other of the second group and between the first branch points adjacent to the second branch point and the second branch point;
a third signal line including a third branch point for receiving an external signal and for connecting between the third branch point and the second branch point of the second group; and
a fourth signal line for connecting between the second branch point of the second group and the first branch point of the first group.

2. The module of claim 1, further comprising:
a register which buffers the external signal and transmits the buffered external signal to the third branch point.

3. The module of claim 1, wherein the fourth signal line is arranged on the same layer as the third signal line.

4. The module of claim 1, wherein the first, second, and third branch points are vias.

5. A memory module, comprising:
a first plurality of memories including an even number of groups, each of the even number of groups having an odd number of at least three memories and a first group including an odd number of memories arranged away from a middle of the even number of groups and a second group including an even number of memories arranged adjacent to the middle of the even number of groups;
first signal lines having first branch points corresponding the first plurality of memories for respectively connecting the first branch points to the first plurality of memories;
second signal lines having second branch points located at a middle of the second groups for respectively connecting the second branch points to the first branch points arranged in a same group as the first branch points adjacent to the second branch points;
third signal lines having a third branch point for receiving an external signal and located at a middle of the even number of groups and for connecting between the third branch point and the first branch points adjacent to the third branch point; and a fourth signal line for respectively connecting between the second branch points and the first branch point of the first group arranged in the same group as the second branch points.

6. The module of claim 5, wherein the third signal lines are arranged on the same layer as the second signal lines.

7. The module of claim 5, further comprising:
a second plurality of memories having a second even number of groups including a third group having an odd number of memories arranged away from the first plurality of memories and a fourth group having a even number of memories adjacent to the first plurality of memories;
fifth signal lines having fourth branch points corresponding to the second plurality of memories for respectively connecting the second plurality of memories to the fourth branch points;
sixth signal lines having fifth branch points located at a middle of the fourth group for respectively connecting between the fifth branch points and the fourth branch points arranged in the fourth group and adjacent to the fifth branch point;
a seventh signal line for connecting the fifth branch point of the fourth group and the fourth branch point of the third group; and
an eighth signal line for connecting between the third branch point located at the middle of the first plurality of memories and the fifth branch point of the fourth group.

8. The module of claim 7, wherein the sixth signal lines are arranged oh the same layer as the second signal lines.

9. The module of claim 7, wherein the seventh signal line is arranged on the same layer as the fourth signal lines.

10. The module of claim 7, wherein the first, second, third, fourth, and fifth branch points are vias.

11. A method of arranging a signal line of a memory module, comprising:
classifying a plurality of memories into a first group including an odd number of memories and a second group including an even number of memories;
arranging first branch points corresponding to the plurality of memories and respectively connecting the first branch points to the plurality of memories through first signal lines;
arranging a second branch point located at a middle of the second group for respectively connecting between the first branch points adjacent to each other of the second group and between the first branch points adjacent to the second branch points and the second branch point through second signal lines;
arranging a third branch point located at a middle of the second group, receiving an external signal, and connecting between the third branch point and the second branch point of the second group through a third signal line; and
connecting between the second branch point of the second group and the first branch point of the first group through a fourth signal line.

12. The method of claim 11, further comprising:
buffering the external signal and transmitting the buffered external signal to the third branch point through a register.

13. The method of claim 11, wherein the fourth signal line is arranged on the same layer as the third signal line.

14. A method of arranging a signal line of a memory module, comprising:
classifying a first plurality of memories into an even number of groups, each of the even number of groups having an odd number of at least three memories, arranging each of the even number of groups into a first group including an odd number of memories arranged away from a middle of each of the even number of groups and a second group including an even number of memories arranged adjacent to the middle of each of the even number of groups;
arranging first branch points corresponding the first plurality of memories and respectively connecting the first branch points to the first plurality of memories through first signal lines;
arranging second branch points located at a middle of the second groups and connecting between the second branch points and the first branch points arranged in a same group as the first branch points adjacent to the second branch points through second signal lines;
arranging a third branch point at a middle of the even of number groups, receiving an external signal, and connecting between the third branch and a first branch point adjacent to the third branch point through third signal lines; and
respectively connecting between the second branch points and the first branch point of the first group arranged in the same group as the second branch points through a fourth signal line.

15. The method of claim 14, wherein the third signal lines are arranged on a same layer as the second signal lines.

16. The method of claim 14, further comprising:
classifying a second plurality of memories having a second even number of groups into a third group having an odd number memories arranged away from a middle of the first even number of groups and a fourth group having an even number of memories adjacent to the middle of the second even number of groups;
arranging fourth branch points corresponding to the second plurality of memories and respectively connecting the second plurality of memories to the fourth branch points through fifth signal lines;
arranging fifth branch points located at a middle of the fourth group and respectively connecting the fifth branch points to the fourth branch points arranged in the fourth group adjacent to the fifth branch point through sixth signal lines;
connecting the fifth branch point of the fourth group to the fourth branch point of the third group through a seventh signal line; and
connecting the third branch point located at the middle of the second even number of groups to the fifth branch point of the fourth group through an eighth signal line.

17. The method of claim 16, wherein the sixth signal lines are arranged on the same layer as the second signal lines.

18. The method of claim 16, wherein the seventh signal line is arranged on the same layer as the fourth signal lines.

* * * * *